(12) United States Patent
Di Teodoro (10) Patent No.: US 10,186,828 B2
(45) Date of Patent: *Jan. 22, 2019

(54) LASER TRANSMITTER FOR GENERATING A COHERENT LASER OUTPUT SIGNAL WITH REDUCED SELF-PHASE MODULATION AND METHOD

(71) Applicant: Raytheon Company, Waltham, MA (US)

(72) Inventor: Fabio Di Teodoro, Hacienda Heights, CA (US)

(73) Assignee: Raytheon Company, Waltham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/827,851

(22) Filed: Nov. 30, 2017

(65) Prior Publication Data

US 2018/0175581 A1 Jun. 21, 2018

Related U.S. Application Data

(63) Continuation of application No. 15/380,056, filed on Dec. 15, 2016, now Pat. No. 9,871,339.

(51) Int. Cl.
*H01S 3/13* (2006.01)
*H01S 3/10* (2006.01)
(Continued)

(52) U.S. Cl.
CPC .......... *H01S 3/10092* (2013.01); *G01S 7/484* (2013.01); *H01S 3/0085* (2013.01);
(Continued)

(58) Field of Classification Search
CPC .. H01S 3/10092; H01S 3/0085; H01S 3/1398; H01S 3/06754; H01S 3/10007;
(Continued)

(56) References Cited

U.S. PATENT DOCUMENTS 5,093,563 A * 3/1992 Small ................... G02B 27/58
250/201.9
5,694,408 A 12/1997 Bolt et al.
(Continued)

FOREIGN PATENT DOCUMENTS

WO 2010057290 A1 5/2010
WO 2005080928 A1 9/2015

OTHER PUBLICATIONS

Palese et al., "Coherent combining of pulsed fiber amplifiers in the nonlinear chirp regime with intra-pulse phase montrol", Optics Express, vol. 20, No. 7, 2012, 14 pages.
(Continued)

*Primary Examiner* — Kinam Park (57) ABSTRACT

A laser transmitter is provided that includes a seed signal generator, an amplitude modulator and a power amplifier. The seed signal generator is configured to generate a seed signal that has a continuous waveform. The amplitude modulator is configured to generate a flat-top pulse signal based on the seed signal. The power amplifier is configured to generate a laser output signal based on the flat-top pulse signal.

21 Claims, 6 Drawing Sheets

(51) Int. Cl.
*H01S 3/107* (2006.01)
*H01S 3/00* (2006.01)
*H01S 3/139* (2006.01)
*H01S 5/065* (2006.01)
*G01S 7/484* (2006.01)
*H01S 3/067* (2006.01)

(52) U.S. Cl.
CPC ............ *H01S 3/107* (2013.01); *H01S 3/1301* (2013.01); *H01S 3/1306* (2013.01); *H01S 3/1307* (2013.01); *H01S 3/1398* (2013.01); *H01S 5/0656* (2013.01); *H01S 3/06754* (2013.01); *H01S 3/10007* (2013.01); *H01S 3/10038* (2013.01); *H01S 2301/04* (2013.01); *H01S 2301/206* (2013.01)

(58) Field of Classification Search
CPC .. H01S 3/10038; H01S 3/1301; H01S 3/1306; H01S 5/0656; H01S 2301/04; H01S 2301/206
See application file for complete search history.

(56) References Cited

U.S. PATENT DOCUMENTS

| | | | |
|---|---|---|---|
| 5,748,655 A | 5/1998 | Yessik et al. | |
| 5,751,830 A | 5/1998 | Hutchinson | |
| 7,539,231 B1* | 5/2009 | Honea | H01S 3/06795 359/333 |
| 7,667,889 B2 | 2/2010 | Murison et al. | |
| 7,872,794 B1* | 1/2011 | Minelly | H01S 3/06758 359/337.13 |
| 9,246,303 B1 | 1/2016 | Rockwell et al. | |
| 9,871,339 B1* | 1/2018 | Di Teodoro | H01S 3/107 |
| 2003/0076485 A1 | 4/2003 | Ruff et al. | |
| 2007/0166049 A1* | 7/2007 | Pearson | G01H 9/00 398/161 |
| 2010/0135347 A1* | 6/2010 | Deladurantaye | H01S 3/06754 372/30 |
| 2011/0182306 A1* | 7/2011 | Hosseini | H01S 3/235 372/25 |
| 2011/0280581 A1* | 11/2011 | Chann | G02B 6/2931 398/98 |
| 2012/0002688 A1 | 1/2012 | Munroe | |
| 2012/0187860 A1* | 7/2012 | Jacob | H04B 10/508 315/246 |
| 2016/0266243 A1 | 9/2016 | Marron | |

OTHER PUBLICATIONS

Limpert et al., "High-power picosecond fiber amplifier based on nonlinear spectral compression", Optics Letters, vol. 30, No. 7, Apr. 2005, pp. 714-716.
Grawert et al., "Automatic feedback control of an Er-doped fiber laser with an intracavity loss modulator," Optics Letters, vol. 30, No. 9, May 2005, pp. 1066-1068.
Dianov, "Amplification in Extended Transmission Bands Using Bismuth-Doped Optical Fibers", Journal of Lightwave Technology, vol. 31, No. 4, Feb. 2013, pp. 681-688.
Lim et al., "Optimizing the pumping configuration for the power scaling of in-band pumped erbium doped fiber amplifiers", Optics Express, vol. 20, No. 13, 2012, 10 pages.
Marron et al., "Atmospheric turbulence correction using digital holographic detection: experimental results," Optics Express, vol. 17, No. 14, 2009, pp. 11638-11651.
International Search Report and Written Opinion of the International Searching Authority for PCT Patent Application No. PCT/US2016/019088 dated Jun. 9, 2016, 14 pages.
Li, "Time-of-Flight Camera—An Introduction," Texas Instruments Technical White Paper, SLOA190B, 2014, 10 pages.
Niclass et al., "Single-Photon Synchronous Detection", IEEE Journal of Solid-State Circuits, vol. 44, No. 7, Jul. 2009, pp. 1977-1989.
International Search Report and Written Opinion of the International Searching Authority for PCT Patent Application No. PCT/US2017/044977 dated Oct. 26, 2017, 13 pages.

\* cited by examiner

LASER TRANSMITTER FOR GENERATING A COHERENT LASER OUTPUT SIGNAL WITH REDUCED SELF-PHASE MODULATION AND METHOD

CROSS-REFERENCE TO RELATED APPLICATION AND CLAIM OF PRIORITY

This application is a continuation of U.S. patent application Ser. No. 15/380,056 filed on Dec. 15, 2016, which is hereby incorporated by reference in its entirety.

TECHNICAL FIELD

This disclosure is directed, in general, to laser systems and, more specifically, to a laser transmitter for generating a coherent laser output signal with reduced self-phase modulation and method.

BACKGROUND

Coherent laser detection and ranging (LADAR) applications use laser sources as optical transmitters to meet many requirements, including high pulse energy/peak power, good spatial beam quality and long pulse coherence time. These transmitters are often implemented with fiber lasers due to their compact/rugged architecture, support for flexible pulse waveform generation and high electric-to-optic efficiency. However, the long and small guiding core of a fiber laser results in issues such as the optical Kerr effect at relatively low peak powers. This parasitic, nonlinear effect manifests itself as self-phase modulation, i.e., an intra-pulse, time-dependent shift in the optical phase, which reduces the pulse coherence time, thereby hampering coherent LADAR.

SUMMARY

This disclosure provides a laser transmitter for generating a coherent laser output signal with reduced self-phase modulation and method.

In a first embodiment, a laser transmitter is provided that includes a seed signal generator, an amplitude modulator and a power amplifier. The seed signal generator is configured to generate a seed signal that has a continuous waveform. The amplitude modulator is configured to generate a flat-top pulse signal based on the seed signal. The power amplifier is configured to generate a laser output signal based on the flat-top pulse signal.

In a second embodiment, a method for generating a laser output signal is provided that includes generating a seed signal that has a continuous waveform. A flat-top pulse signal is generated based on the seed signal. The laser output signal is generated based on the flat-top pulse signal.

In a third embodiment, a laser transmitter is provided that includes a seed signal generator, a plurality of amplitude modulators and a plurality of power amplifiers. The seed signal generator is configured to generate a seed signal that has a continuous waveform. Each of the amplitude modulators is configured to modulate an amplitude of an input signal to generate a flat-top pulse signal. The amplitude modulators include a first amplitude modulator that is configured to modulate an amplitude of the seed signal to generate a first flat-top pulse signal. Each power amplifier corresponds to one of the amplitude modulators and is configured to amplify the flat-top pulse signal generated by the corresponding amplitude modulator to generate an amplified signal. Each of a subset of the power amplifiers is configured to provide the amplified signal as the input signal for a subsequent amplitude modulator.

In a fourth embodiment, a method for generating a laser output signal is provided that includes generating a seed signal that has a continuous waveform. A plurality of flat-top pulse signals is generated. A first flat-top pulse signal is generated based on the seed signal. An amplified signal is generated for each of the flat-top pulse signals. The laser output signal is generated based on a final one of the flat-top pulse signals.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 6, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

Solid-state lasers are subject to self-phase modulation, which reduces the coherence time of laser pulses, resulting in unwanted spectral broadening. Short coherence times especially hamper coherent-detection LADAR, and broad spectrum generally reduces spectral selectivity. Therefore, self-phase modulation effectively limits the peak power achievable in solid-state lasers with the result that these lasers may be unusable for LADAR or other remote sensing applications.

A direct approach to mitigating self-phase modulation in solid-state lasers has been to maximize the optical beam cross-sectional area within the laser medium. As the beam area increases, the optical intensity for a given pulse power becomes lower. In turn, a lower optical intensity proportionally raises the pulse power at which self-phase modulation sets in. In fiber lasers, this approach requires using fibers of increasingly large guiding cores. However, the beam size in a laser medium cannot be arbitrary, but must satisfy several concurrent constraints including maximization of beam quality. Increasing beam size may lead to loss of spatial beam quality and/or loss of efficiency. In fiber lasers, ensuring single-transverse-mode operation becomes more difficult as the core becomes larger. The residual guidance of high-order transverse modes in large-core fibers may make such fibers more sensitive to thermo-mechanical perturbations from the surroundings (i.e., less rugged) and potentially degrade the spatial beam quality and pointing, thus offsetting the benefit of higher pulse power in certain applications, such as LADAR applications.

Another approach to mitigating self-phase modulation has relied on the fact that the phase shift caused by self-phase modulation is proportional to the derivative of the pulse amplitude with respect to time. An optical phase modulator can thus be used to counter-shift the optical phase in pulses such that, as self-phase modulation sets in, the net phase variation during the pulse is minimized. This approach requires detecting the temporal profile of each laser output pulse and using this data to extract a correction signal that the phase modulator then uses to ensure the successive pulse is self-phase-modulation free (i.e., a feed-forward active loop).

However, as the peak power increases, self-phase modulation becomes faster and thus the complexity and signal bandwidth required to drive this feed-forward loop may become unmanageable quickly. In addition, LADAR systems often have severe size, weight and power (SWaP) constraints on the platforms in which the LADAR systems are deployed. As a result, the additional SWaP requirements associated with the increasingly complex components used to implement a feed-forward loop for large-core fibers may render this approach unusable for many applications.

Figure 1:
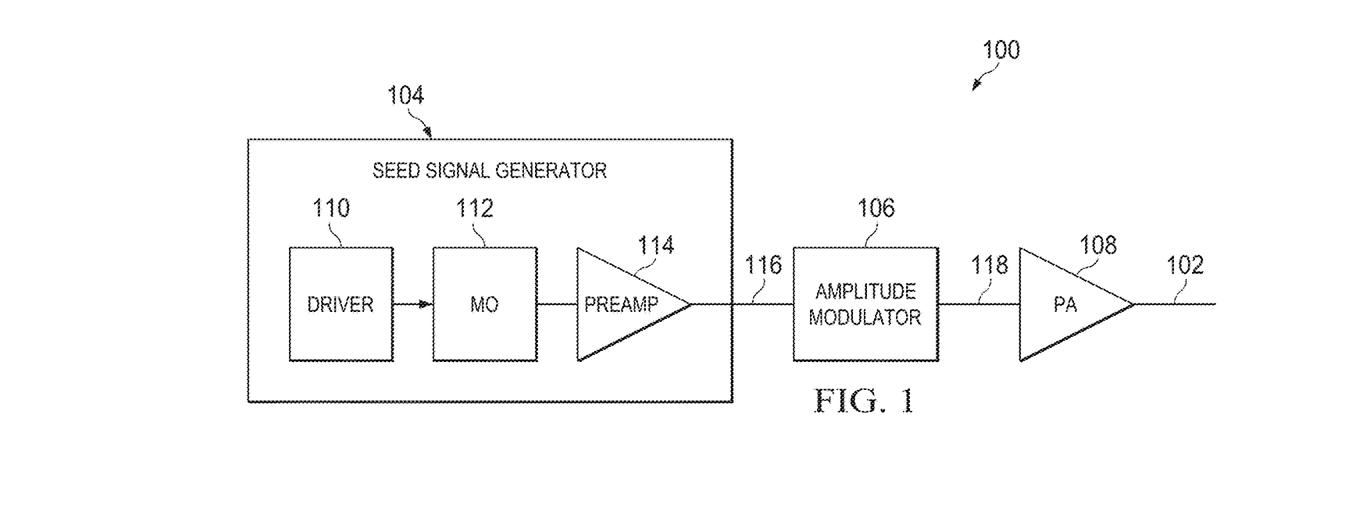
FIG. 1 illustrates a laser transmitter for generating a coherent laser output signal with reduced self-phase modulation in accordance with this disclosure.

FIG. 1 illustrates a laser transmitter 100 for generating a coherent laser output signal 102 with reduced self-phase modulation in accordance with this disclosure. The embodiment of the laser transmitter 100 shown in FIG. 1 is for illustration only. Other embodiments of the laser transmitter 100 could be used without departing from the scope of this disclosure.

As shown in FIG. 1, the laser transmitter 100 is implemented with a master oscillator/power amplifier (MOPA) configuration. For this embodiment, the laser transmitter 100 includes a seed signal generator 104, an electro-optic amplitude modulator 106 and a power amplifier (PA) 108. The seed signal generator 104 in this example includes a driver 110, a master oscillator (MO) 112 and a preamplifier 114.

The driver 110 is configured to drive and control the master oscillator 112. The master oscillator 112 is configured to generate an output signal based on input from the driver 110. Thus, the output waveform of the master oscillator 112 may be determined based on the input received from the driver 110. For example, the output of the master oscillator 112 may include a continuous waveform. The output of the master oscillator 112 is provided to the preamplifier 114, which is configured to amplify that output to generate a seed signal 116.

The driver 110 includes any suitable structure for driving and controlling an output of the seed signal generator 104. The master oscillator 112 includes any suitable structure for generating a continuous-wave optical signal, such as a continuous-wave, single-frequency diode laser. The preamplifier 114 includes any suitable structure for amplifying an optical signal.

The amplitude modulator 106 is configured to receive the seed signal 116 from the seed signal generator 104 and to generate a flat-top pulse signal 118 based on the seed signal 116. As used herein, a "flat-top pulse" means a pulse having a flat-top temporal profile, such as the example illustrated in FIG. 3C below. Thus, a flat-top pulse is a pulse having a temporal profile with no amplitude change during a predefined portion of the pulse, with the predefined portion determined based on the application in which the laser transmitter 100 is implemented. For example, for a particular embodiment, the predefined portion may be greater than 90% of the pulse. For other embodiments, the predefined portion may be greater than 99% of the pulse. For some embodiments, the amplitude modulator 106 may be configured to generate the flat-top pulse signal 118 by acting as a chopper, alternately blocking the light of the seed signal 116 and letting the light pass at regular intervals to generate flat-top pulses.

The amplitude modulator 106 includes any suitable structure for modulating the amplitude of the seed signal 116, such as a lithium-niobate, fiber-coupled Mach-Zehnder modulator (MZM). For example, commercially available MZMs can generate pulses with rise/fall times less than 100 picoseconds. As pulses used in many coherent LADAR applications, for example, are typically a few nanoseconds long, MZM-generated pulses can be flat for over 90% of their duration. Since the optical phase variation caused by self-phase modulation is proportional to the derivative of the pulse shape function with respect to time, there is no phase shift during the flat portion of the pulse, regardless of pulse power. The phase shift is then confined to the rising and falling edges of the pulse, which contain only a small fraction of the total pulse energy.

The power amplifier 108 is configured to generate the coherent laser output signal 102 based on the flat-top pulse signal 118 received from the amplitude modulator 106 by amplifying the flat-top pulse signal 118. Thus, the laser output signal 102 has higher-amplitude pulses compared to the flat-top pulse signal 118. The power amplifier 108 includes any suitable structure for amplifying optical signals, such as an ordinary rare-earth-doped fiber, a specialty fiber such as a semi-guiding high-aspect-ratio core (SHARC) fiber or micro-structured fiber, a rare-earth-doped planar waveguide (PWG), or a rare-earth-doped bulk (non-wave-guided) crystal, to mention a few. The power amplifier 108 has the capacity to generate peak and average powers in accordance with a specific application of interest. As a particular example, the power amplifier 108 could be implemented using a fiber amplifier with high efficiency, good beam quality, and desirable SWaP characteristics.

Because the phase shifts associated with self-phase modulation mimic the amplitude profiles of pulses generated by the laser transmitter 100, no phase shift occurs during the flat-top portion of a flat-top pulse because there is no amplitude change. Therefore, because the pulses generated by the laser transmitter 100 exhibit very fast rise and fall times with the pulse profile staying flat during most of the pulse duration, the laser output signal 102 generated by the laser transmitter 100 includes minimal self-phase modulation. Accordingly, the power of pulses generated by fiber lasers may be scaled up significantly without incurring the coherence degradation caused by self-phase modulation, thus improving the capability of fibers used in optical transmitters for coherent LADAR and other suitable applications.

In this way, the benefits of fiber technology (e.g., good beam quality and ruggedness) for LADAR and other applications may be maintained without requiring large-core fibers or a broadband feed-forward/feedback loop involving phase detection and correction. However, the laser transmitter 100 is also compatible with other approaches. For example, if desired, the laser transmitter 100 can be used in combination with large-core fibers and/or the phase-correction schemes described above in order to further scale up fiber-laser pulse power without coherence degradation.

Although FIG. 1 illustrates one example of a laser transmitter 100, various changes may be made to the embodiment of FIG. 1. For example, various components of the laser transmitter 100 could be combined, further subdivided, moved, or omitted and additional components could be added according to particular needs. As a specific example, the preamplifier 114 could represent one or more preamplifiers as opposed to a single preamplifier. In addition, the amplitude modulator 106 could represent multiple amplitude modulators and the power amplifier 108 could represent multiple power amplifiers, similar to the embodiment of FIG. 2.

Figure 2:
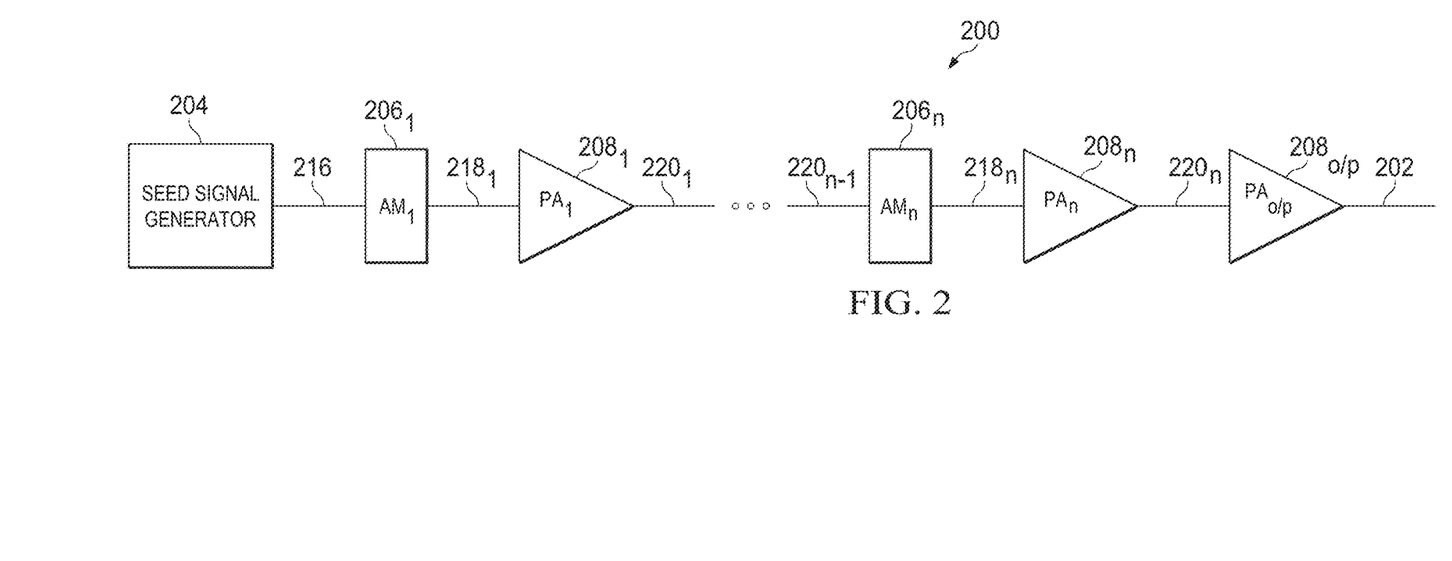
FIG. 2 illustrates a laser transmitter for generating a coherent laser output signal with reduced self-phase modulation in accordance with another embodiment of this disclosure.

FIG. 2 illustrates a laser transmitter 200 for generating a coherent laser output signal 202 with reduced self-phase modulation in accordance with another embodiment of this disclosure. The embodiment of the laser transmitter 200 shown in FIG. 2 is for illustration only. Other embodiments of the laser transmitter 200 could be used without departing from the scope of this disclosure.

For the illustrated embodiment, the laser transmitter 200 includes a seed signal generator 204, a plurality of electro-optic amplitude modulators (AM) 206 and a plurality of power amplifiers (PA) 208. The seed signal generator 204 is configured to generate a seed signal 216 having a continuous waveform. For some embodiments, the seed signal generator 204 may correspond to the seed signal generator 104. Thus, the seed signal generator 204 may include a driver, a master oscillator and a preamplifier configured to generate an amplified, continuous-wave optical signal as the seed signal 216.

For this embodiment, the plurality of amplitude modulators 206 may be used in synchronization with each other to create extinction of the pulses and to make pulse contrast higher in the final laser output signal 202. The first amplitude modulator $206_1$ is configured to receive the seed signal 216 from the seed signal generator 204 and to generate a first flat-top pulse signal $218_1$ based on the seed signal 216. The first power amplifier $208_1$ is configured to receive the first flat-top pulse signal $218_1$ and to generate a first amplified signal $220_1$ based on the first flat-top pulse signal $218_1$.

Similarly, each subsequent amplitude modulator $206_{2-n}$ is configured to receive an amplified signal 220 from a preceding power amplifier 208 and to generate a flat-top pulse signal 218 based on the amplified signal 220. Likewise, each subsequent power amplifier $208_{2-n}$ (except for a final, output power amplifier $208_{o/p}$) is configured to receive a flat-top pulse signal 218 from a preceding amplitude modulator 206 and to generate an amplified signal 220 based on the flat-top pulse signal 218. The output power amplifier $208_{o/p}$ is configured to receive the amplified signal $220_n$ from the power amplifier $208_n$ and to generate the laser output signal 202 based on the amplified signal $220_n$.

The amplitude modulators $206_{1-n}$ may each correspond to the amplitude modulator 106. For example, for some embodiments, the amplitude modulators $206_{1-n}$ may each include any suitable structure for modulating the amplitude of an input signal, such as a lithium-niobate, fiber-coupled MZM. In addition, the power amplifiers $208_{1-n}$ and the output power amplifier $208_{o/p}$ may correspond to the power amplifier 108. For example, for some embodiments, the power amplifiers $208_{1-n}$ and $208_{o/p}$ may each include any suitable structure for amplifying optical signals, such as an ordinary rare-earth-doped fiber, a specialty fiber such as a SHARC fiber or micro-structured fiber, a rare-earth-doped PWG, a rare-earth-doped bulk (non-wave-guided) crystal, or other suitable amplifier.

Although FIG. 2 illustrates one example of a laser transmitter 200, various changes may be made to the embodiment of FIG. 2. For example, various components of the laser transmitter 200 could be combined, further subdivided, moved, or omitted and additional components could be added according to particular needs. As a specific example, the final power amplifier $208_{o/p}$ may be omitted, and the amplified signal $220_n$ generated by the $n^{th}$ power amplifier $208_n$ may correspond to the laser output signal 202. In addition, the number n may be any suitable integer greater than or equal to 2.

FIGS. 3A-3F illustrate graphs of laser pulses and interference terms in accordance with this disclosure. The graphs 300, 320, 340, 360, 365 and 380 shown in FIGS. 3A-F are for illustration only.

The optical field in a laser amplifier may be expressed as follows:

$$E(z,t) = g(z)A(z=0)\sqrt{f(t)}e^{i(kz-\omega t+\varphi)}$$

where z is the position along a laser medium, g is the optical gain, A is the input peak amplitude, f is the normalized pulse power profile, t is time, k is the propagation constant, $\omega$ is the carrier frequency and $\varphi$ is the optical phase. In addition, the optical phase may be defined as follows:

$$\varphi = \varphi_0 + \varphi_{NL},$$

where $\varphi_0$ is a static term and $\varphi_{NL}$ is a nonlinear term corresponding to the amount of self-phase modulation, which may be written as:

$$\varphi_{NL}(t) = Bf(t),$$

where $$B = \frac{2\pi n_2}{\lambda} \int_0^L I(z)dz$$

and where $n_2$ is the nonlinear refractive index coefficient, $\lambda$ is the wavelength, L is the amplifier length and I(z) is the optical intensity at the pulse peak.

Figure 3A:
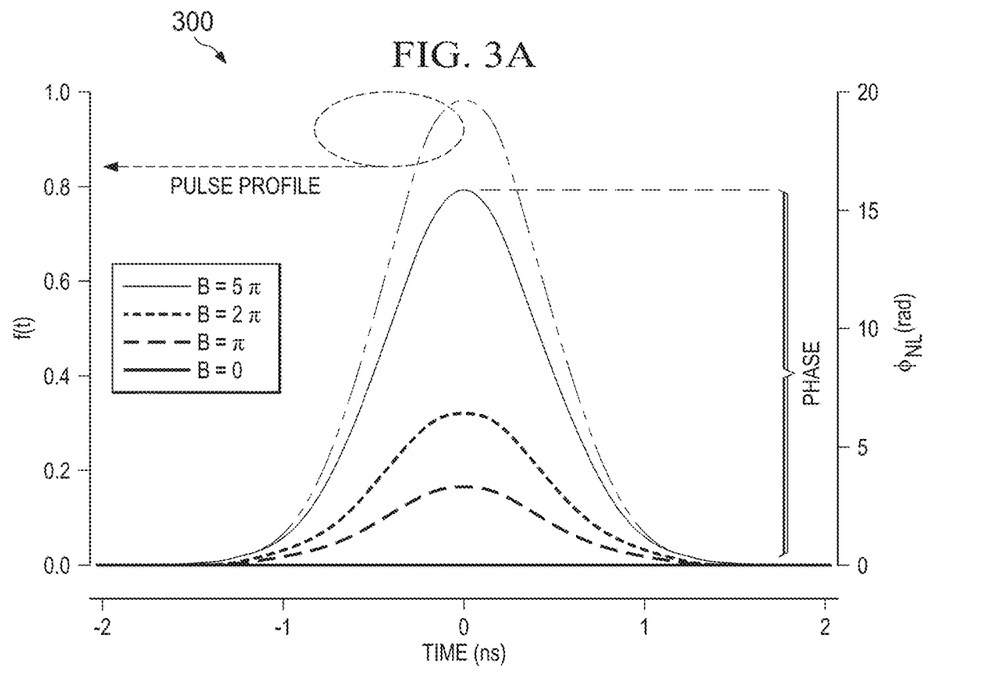
FIGS. 3A-3F illustrate graphs of laser pulses and interference terms in accordance with this disclosure.
Figure 3B:
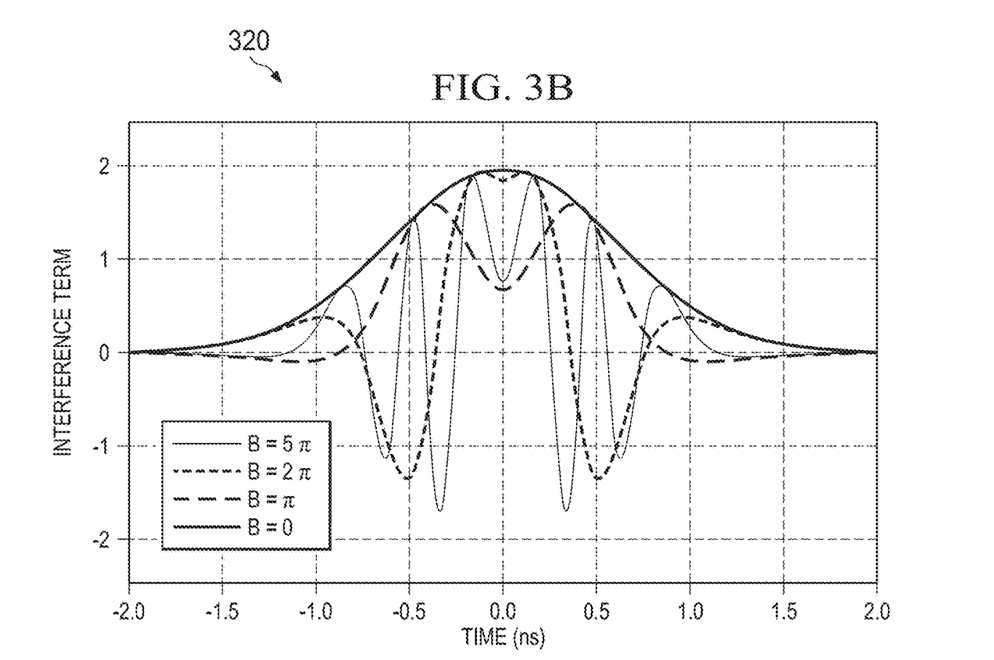

FIG. 3A is a graph 300 of the pulse profiles corresponding to a pulse having a Gaussian amplitude profile with varying B values (corresponding to varying pulse peak power). In the same graph 300, the temporal profile of the phase shift corresponding to each B value is also plotted (right vertical axis). FIG. 3B is a graph 320 of the interference term between a laser pulse having varying B values illustrated in the graph 300, and a continuous-wave single-frequency signal (referred to as "local oscillator"). The overall interference function may be expressed as:

$$S(T) = f(t) + c_{LO} + 2\sqrt{c_{LO}f(t)} \cos[\varphi_0 + \varphi_{NL}(t)]$$

where $c_{LO}$ is the local oscillator constant power (normalized to the pulse peak power) and $2\sqrt{c_{LO}f(t)} \cos[\varphi_0 + \varphi_{NL}(t)]$ is the interference term, with:

$$\cos[\varphi_0 + \varphi_{NL}(t)] \begin{aligned} &= 1 \text{ for constructive interference} \\ &= -1 \text{ for destructive interference,} \\ &= 0 \text{ for incoherent sum.} \end{aligned}$$

Thus, as shown in the graphs 300 and 320, for Gaussian pulses, self-phase modulation effects exist throughout the pulses, which decreases the coherence time of the pulses. This results in spectral broadening, which generally reduces spectral selectivity and limits the peak power achievable in solid-state lasers.

Figure 3C:
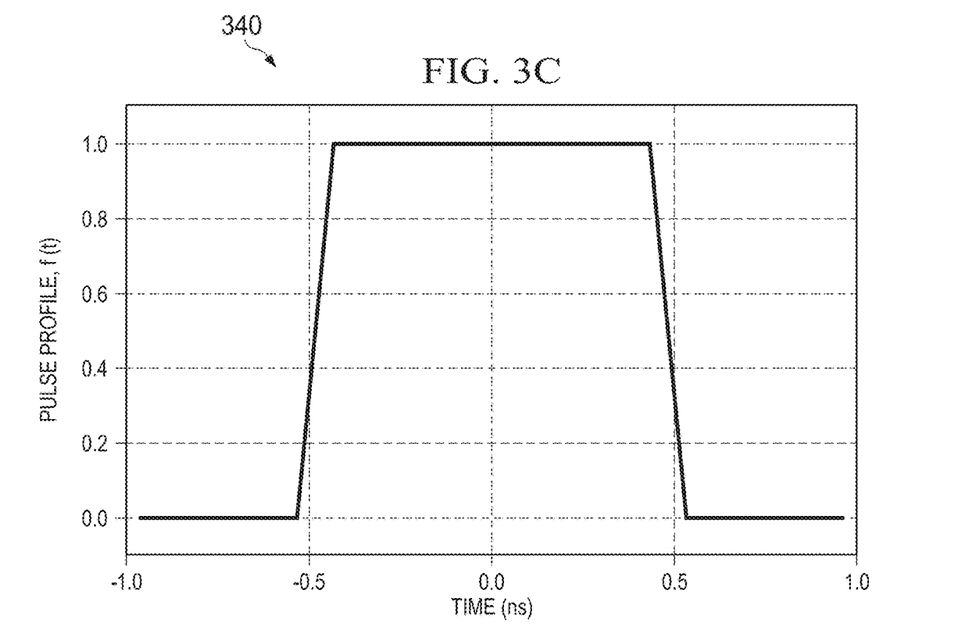
Figure 3D:
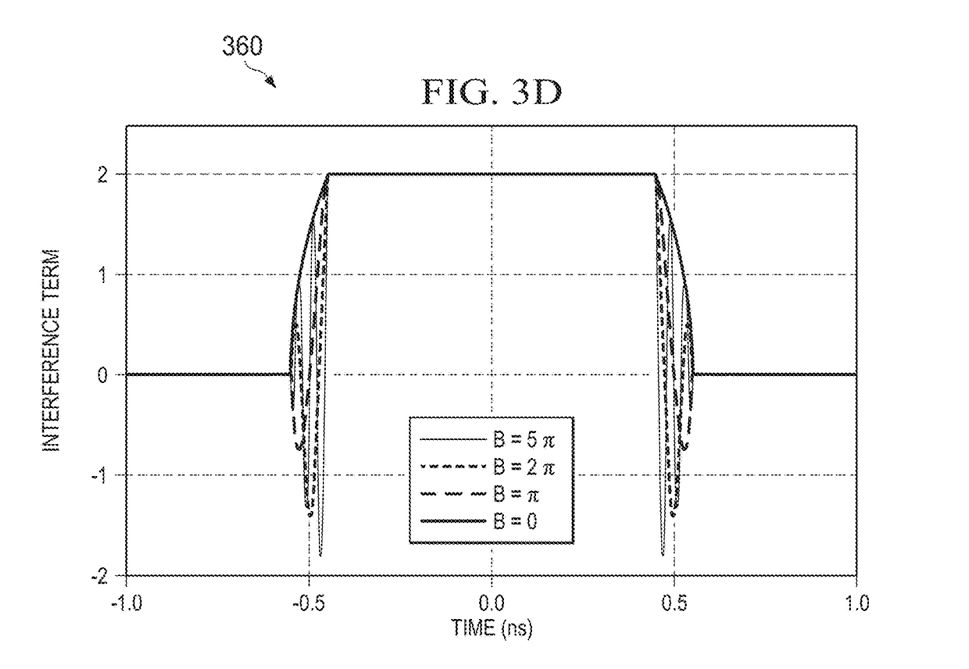
Figure 3E:
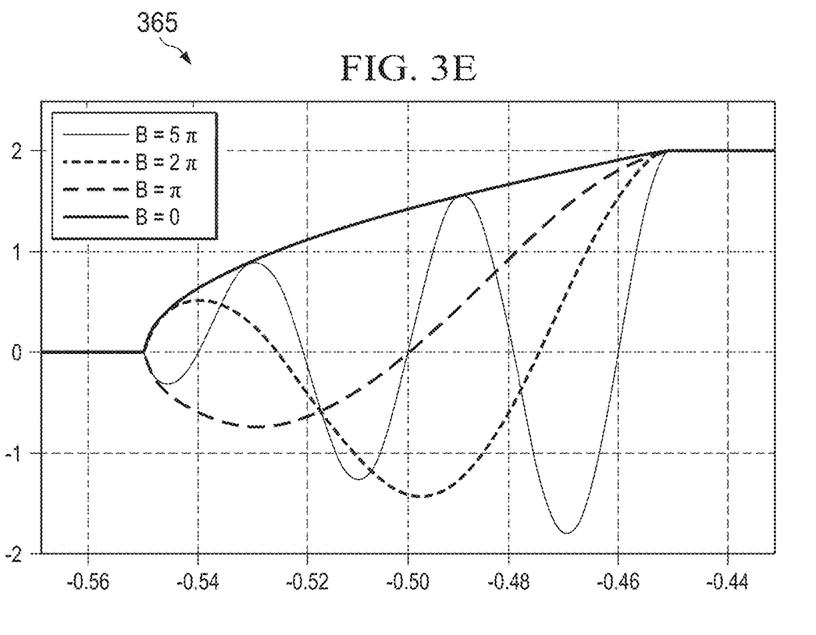

FIG. 3C is a graph 340 of a pulse profile corresponding to a flat-top pulse signal 116, 216. For this particular embodiment, the rise time of the pulse is about 100 picoseconds, the fall time is about 100 picoseconds, and the flat-top portion with no amplitude change is about 1 nanosecond. FIG. 3D is a graph 360 of the interference term corresponding to the self-phase modulation coherence degradation for the pulse shown in the graph 340 for various B values. Thus, as shown in the graph 360, the interference term is flat during the flat portion of the corresponding pulse in the graph 340. As self-phase modulation is confined to the rising and falling edges of the pulse, FIG. 3E is a graph 365 illustrating an expanded view of the rising edge interference shown in the graph 360 to illustrate more clearly the interference corresponding to the various B values.

Figure 3F:
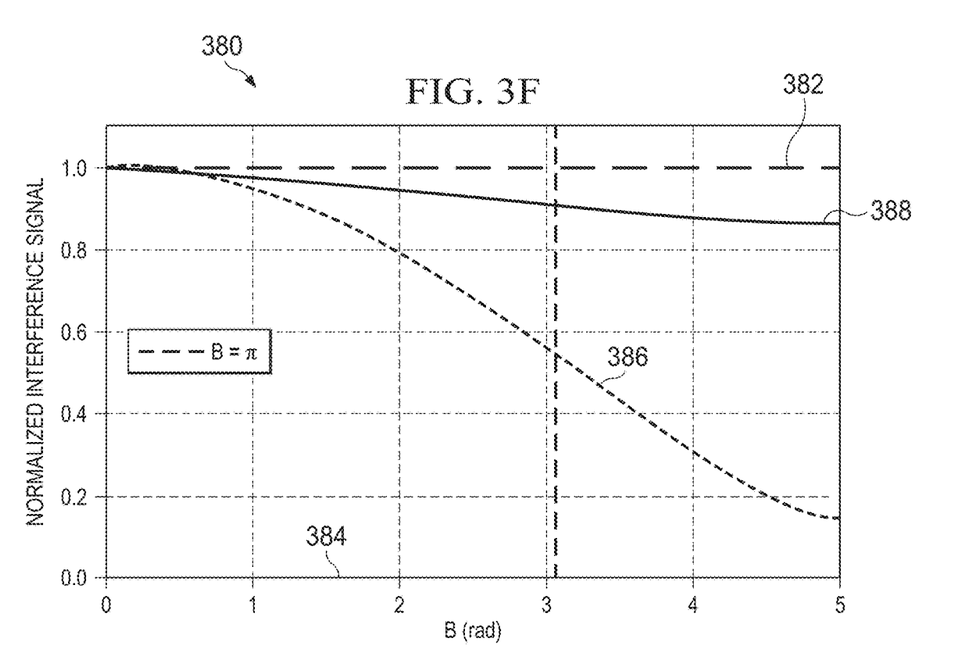

Finally, for the illustrated embodiment, FIG. 3F is a graph 380 illustrating the normalized interference signal for the pulses shown in the graphs 300 and 340 for various B values. The interference signal is obtained by integrating the interference term with respect to time and, in many embodiments, represents the signal detected in typical coherent LADAR applications. An upper line 382 indicates the maximum coherence, while a zero line 384 indicates an incoherent sum. Thus, for the Gaussian pulses of the graph 300, a Gaussian coherence line 386 shows the declining coherence associated with increasing B values. For the flat-top pulse of the graph 340, a flat-top coherence line 388 shows a much higher and more consistent coherence (as compared to the Gaussian coherence line 386) that only drops slightly with increasing B values. Thus, as shown in the graph 380, a flat-top pulse signal 116, 216 greatly minimizes the coherence degradation due to self-phase modulation that occurs to a much greater extent with a Gaussian pulse waveform.

Figure 4:
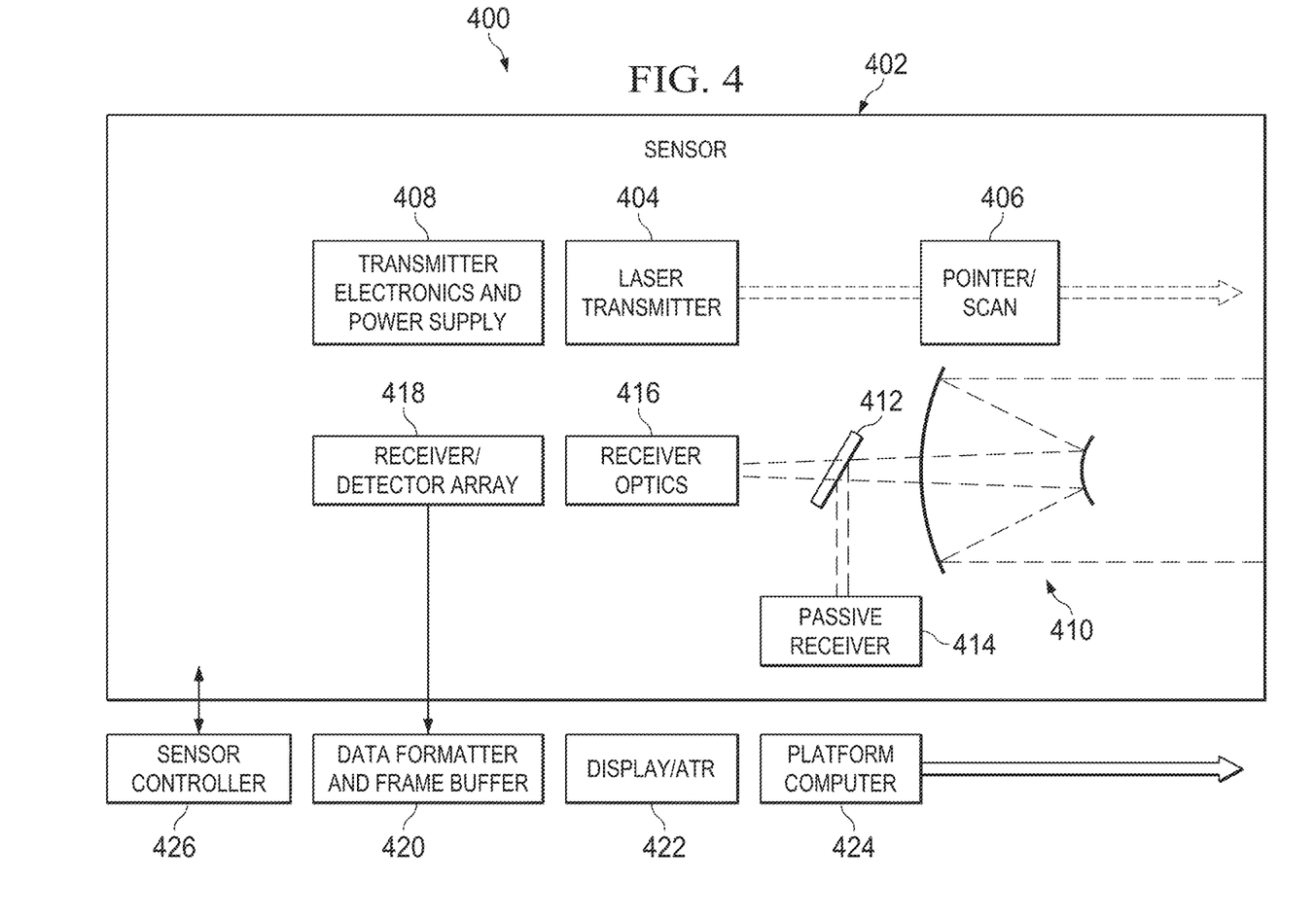
FIG. 4 illustrates a LADAR system including the laser transmitter of FIG. 1 or 2 in accordance with this disclosure.

FIG. 4 illustrates a LADAR system 400 including a sensor 402 that includes a laser transmitter 404 in accordance with this disclosure. The embodiment of the LADAR system 400 shown in FIG. 4 is for illustration only as one example of an application implementing the laser transmitter 404. Other embodiments of the LADAR system 400 including the laser transmitter 404 could be used without departing from the scope of this disclosure. For some embodiments, the laser transmitter 404 may correspond to the laser transmitter 100 or 200.

A laser output signal having a flat-top pulse waveform is provided from the laser transmitter 404 to a pointer/scan unit 406, which can direct the output laser beam in desired directions. For instance, the pointer/scan unit 406 could sweep a given area with the beam in order to identify aircraft, vehicles, cyclists, pedestrians, or other targets/objects of interest. For example, for a particular embodiment, the LADAR system 400 may be implemented as part of a weapons system, and the pointer/scan unit 406 could identify objects to be targeted for destruction. For another particular embodiment, the LADAR system 400 may be implemented in a self-driving vehicle, and the pointer/scan unit 406 could identify objects in the road to assist in maneuvering the vehicle. A transmitter electronics and power supply unit 408 provides power and control signals to the laser transmitter 404 and the pointer/scan unit 406 in order to control the generation and steering of the output laser beam.

Laser illumination reflected from at least one object of interest can be received at the sensor 402 via a telescope 410, which directs the laser illumination to a splitter or steering mirror 412. The splitter or steering mirror 412 can deliver part or all of the laser illumination to a passive receiver 414. The splitter or steering mirror 412 can also deliver part or all of the laser illumination to receiver optics 416 that focus the laser illumination onto a receiver/detector array 418. The passive receiver 414 can engage in passive target/object detection, while the receiver/detector array 418 can support active or semi-active target/object detection.

Data from the receiver/detector array 418 can be provided to a data formatter and frame buffer 420, which formats the data in a suitable manner. A display or automatic target recognition (ATR) unit 422 displays information, such as potential or acquired targets identified by the sensor 402 using the laser illumination. A platform computer 424 can support various functions such as data processing, target acquisition, and guidance commands for directing the sensor 402 towards an object. A sensor controller 426 can control various operations of the sensor 402, such as operations of the passive receiver 414 or the receiver/detector array 418.

Although FIG. 4 illustrates one example of a LADAR system 400 including a laser transmitter 404, various changes may be made to the embodiment of FIG. 4. For example, while described as using laser illumination for target acquisition, various other applications can use the transmission of laser illumination and the detection of reflected laser illumination.

Figure 5:
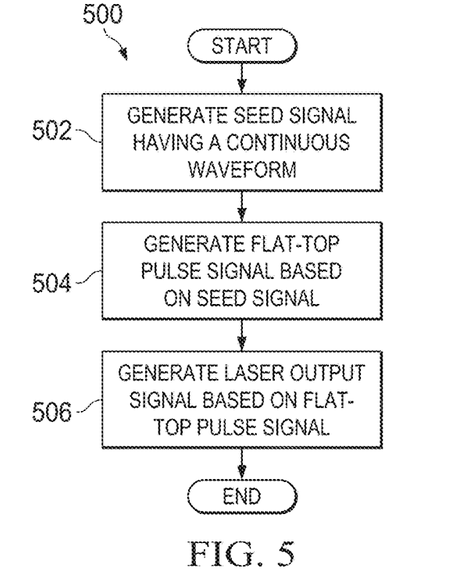
FIG. 5 illustrates a method for generating a coherent laser output signal with reduced self-phase modulation in accordance with this disclosure.

FIG. 5 illustrates a method 500 for generating a coherent laser output signal 102 with reduced self-phase modulation in accordance with this disclosure. The method 500 shown in FIG. 5 is for illustration only. A coherent laser output signal 102 with reduced self-phase modulation may be generated in any other suitable manner without departing from the scope of this disclosure.

Initially, a seed signal 116 having a continuous waveform is generated (step 502). For example, for a particular embodiment, a seed signal generator 104 could generate the seed signal 116. A flat-top pulse signal 118 is generated based on the seed signal 116 (step 504). For example, for a particular embodiment, an amplitude modulator 106 could generate the flat-top pulse signal 118 by modulating the amplitude of the seed signal 116. The laser output signal 102 is generated based on the flat-top pulse signal 118 (step 506). For example, for a particular embodiment, a power amplifier 108 could generate the laser output signal 102 by amplifying the flat-top pulse signal 118.

In this way, self-phase modulation may be corrected by shaping (into flat-top waveforms) the amplitude of pulses prior to amplification, without requiring the detection of amplified pulse profiles and/or feed-back/feed-forward loops with pulse information. In addition, fully coherent pulses may be generated with pulse energy that is at least an order of magnitude greater than would be possible with Gaussian pulses. As a result, fiber lasers may be used for high-power coherent laser transmitters, such as the laser transmitter 100, while being minimally affected by self-phase modulation.

Although FIG. 5 illustrates one example of a method 500 for generating a coherent laser output signal 102 with reduced self-phase modulation, various changes may be made to the embodiment shown in FIG. 5. For example, while shown as a series of steps, various steps in FIG. 5 could overlap, occur in parallel, occur in a different order, or occur multiple times.

Figure 6:
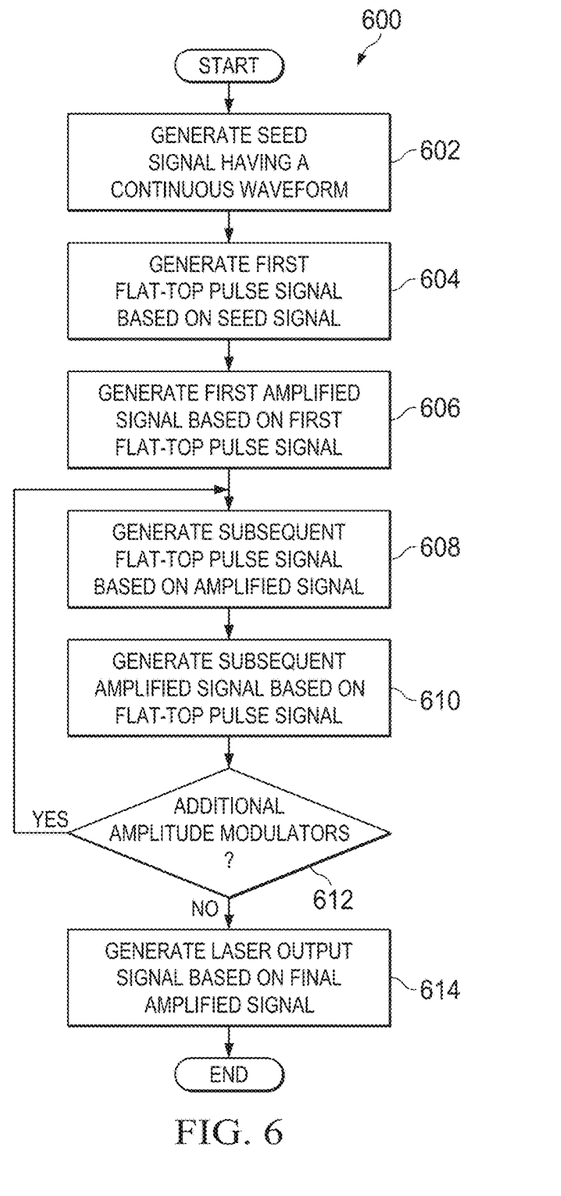
FIG. 6 illustrates a method for generating a coherent laser output signal with reduced self-phase modulation in accordance with another embodiment of this disclosure.

FIG. 6 illustrates a method 600 for generating a coherent laser output signal 202 with reduced self-phase modulation in accordance with this disclosure. The method 600 shown in FIG. 6 is for illustration only. A coherent laser output signal 202 with reduced self-phase modulation may be generated in any other suitable manner without departing from the scope of this disclosure.

Initially, a seed signal 216 having a continuous waveform is generated (step 602). For example, for a particular embodiment, a seed signal generator 204 could generate the seed signal 216. A first flat-top pulse signal $218_1$ is generated based on the seed signal 216 (step 604). For example, for a particular embodiment, an amplitude modulator $206_1$ could generate the first flat-top pulse signal $218_1$ by modulating the amplitude of the seed signal 216. A first amplified signal $220_1$ is generated based on the first flat-top pulse signal $218_1$ (step 606). For example, for a particular embodiment, a power amplifier $208_1$ could generate the first amplified signal $220_1$ by amplifying the first flat-top pulse signal $218_1$.

A subsequent flat-top pulse signal 218 is generated based on an amplified signal 220 (step 608). For example, for a particular embodiment, an amplitude modulator $206_2$ could generate the subsequent flat-top pulse signal $218_2$ by modulating the amplitude of the first amplified signal $220_1$. A subsequent amplified signal 220 is generated based on a flat-top pulse signal 218 (step 610). For example, for a particular embodiment, a power amplifier $208_2$ could generate the subsequent amplified signal $220_2$ by amplifying the subsequent flat-top pulse signal $218_2$.

If there are additional amplitude modulators 206 (step 612), the method returns to steps 608 and 610 where a subsequent amplitude modulator 206 and a subsequent power amplifier 208 generate a subsequent flat-top pulse signal 218 and a subsequent amplified signal 220, respectively. For example, for a particular embodiment, amplitude modulators $206_{3-n}$ could, in turn, successively generate subsequent flat-top pulse signals $218_{3-n}$ by modulating the amplitude of corresponding amplified signals $220_{2-(n-1)}$. In addition, for this particular embodiment, power amplifiers $208_{3-n}$ could, in turn, successively generate subsequent amplified signals $220_{3-n}$ by amplifying the corresponding flat-top pulse signals $218_{3-n}$.

If there are no additional amplitude modulators 206 (step 612), the laser output signal 202 is generated based on the final amplified signal 220 (step 614). For example, for a particular embodiment, an output power amplifier $208_{o/p}$ could generate the laser output signal 202 by amplifying the final, subsequent amplified signal $220_n$ generated by the power amplifier $208_n$. As another example, the power amplifier $208_n$ could provide the final, subsequent amplified signal $220_n$ as the laser output signal 202.

In this way, self-phase modulation may be corrected by shaping (into flat-top waveforms) the amplitude of pulses prior to amplification, without requiring the detection of amplified pulse profiles and/or feed-back/feed-forward loops with pulse information. In addition, fully coherent pulses may be generated with pulse energy that is at least an order of magnitude greater than would be possible with Gaussian pulses. As a result, fiber lasers may be used for high-power coherent laser transmitters, such as the laser transmitter 200, while being minimally affected by self-phase modulation.

Although FIG. 6 illustrates one example of a method 600 for generating a coherent laser output signal 202 with reduced self-phase modulation, various changes may be made to the embodiment shown in FIG. 6. For example, while shown as a series of steps, various steps in FIG. 6 could overlap, occur in parallel, occur in a different order, or occur multiple times.

Modifications, additions, or omissions may be made to the apparatuses and methods described herein without departing from the scope of the disclosure. For example, the components of the apparatuses may be integrated or separated. The methods may include more, fewer, or other steps. Additionally, as described above, steps may be performed in any suitable order.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above descriptions of various embodiments does not define or constrain this disclosure. Other changes, substitutions, and alterations are also possible without departing from the spirit and scope of this disclosure, as defined by the following claims.

What is claimed is:

1. An apparatus comprising:
a modulator configured to amplitude-modulate a continuous-wave input signal and generate a flat-top pulse signal; and
a power amplifier configured to amplify the flat-top pulse signal and generate an output signal.

2. The apparatus of claim 1, further comprising:
a driver;
a master oscillator configured to generate an output based on input from the driver; and
a preamplifier configured to amplify the output from the master oscillator and generate a seed signal, the seed signal representing the continuous-wave input signal.

3. The apparatus of claim 1, wherein the modulator comprises a Mach-Zehnder modulator.

4. The apparatus of claim 1, wherein:
the flat-top pulse signal comprises a plurality of pulses; and
phase shifting of the flat-top pulse signal is confined to rising and falling edges of the pulses.

5. The apparatus of claim 1, wherein:
the modulator comprises a first modulator;
the power amplifier comprises a first power amplifier; and
the apparatus further comprises:
a second modulator configured to amplitude-modulate the output signal and generate a second flat-top pulse signal; and
a second power amplifier configured to amplify the second flat-top pulse signal and generate a second output signal.

6. The apparatus of claim 1, wherein:
the apparatus comprises a plurality of modulators and a plurality of power amplifiers that are interleaved and connected in series; and
a final one of the power amplifiers is configured to generate a laser output signal.

7. The apparatus of claim 1, wherein the output signal comprises a laser output signal.

8. A system comprising:
a laser transmitter configured to generate a laser output signal, the laser transmitter comprising (i) a modulator configured to amplitude-modulate a continuous-wave input signal and generate a flat-top pulse signal and (ii) a power amplifier configured to amplify the flat-top pulse signal and generate an output signal; and
a pointer/scanner configured to direct the laser output signal in at least one desired direction.

9. The system of claim 8, further comprising:
at least one receiver configured to receive laser illumination reflected from at least one object, the laser illumination contained in the laser output signal.

10. The system of claim 8, wherein the laser transmitter further comprises:
a driver;
a master oscillator configured to generate an output based on input from the driver; and
a preamplifier configured to amplify the output from the master oscillator and generate a seed signal, the seed signal representing the continuous-wave input signal.

11. The system of claim 8, wherein the modulator comprises a Mach-Zehnder modulator.

12. The system of claim 8, wherein:
the flat-top pulse signal comprises a plurality of pulses; and
phase shifting of the flat-top pulse signal is confined to rising and falling edges of the pulses.

13. The system of claim 8, wherein:
the modulator comprises a first modulator;
the power amplifier comprises a first power amplifier; and
the laser transmitter further comprises:
a second modulator configured to amplitude-modulate the output signal and generate a second flat-top pulse signal; and
a second power amplifier configured to amplify the second flat-top pulse signal and generate a second output signal.

14. The system of claim 8, wherein:
the laser transmitter comprises a plurality of modulators and a plurality of power amplifiers that are interleaved and connected in series; and
a final one of the power amplifiers is configured to generate the laser output signal.

15. The system of claim 8, wherein the output signal comprises the laser output signal.

16. A method comprising:
amplitude-modulating a continuous-wave input signal to generate a flat-top pulse signal; and
amplifying the flat-top pulse signal to generate an output signal.

17. The method of claim 16, further comprising:
generating a seed signal, the seed signal representing the continuous-wave input signal.

18. The method of claim 16, wherein:
the flat-top pulse signal comprises a plurality of pulses; and
phase shifting of the flat-top pulse signal is confined to rising and falling edges of the pulses.

19. The method of claim 16, further comprising:
amplitude-modulating the output signal to generate a second flat-top pulse signal; and
amplifying the second flat-top pulse signal to generate a second output signal.

20. The method of claim 19, further comprising:
amplitude-modulating the second output signal to generate a third flat-top pulse signal; and
amplifying the third flat-top pulse signal to generate a third output signal.

21. The apparatus of claim 1, wherein:
the power amplifier is configured to receive the flat-top pulse signal as an input from the modulator; and
the modulator is separate from the power amplifier.

* * * * *